(12) United States Patent
Schmajew et al.

(10) Patent No.: US 8,691,369 B2
(45) Date of Patent: Apr. 8, 2014

(54) ELEMENT WITH OPTICAL MARKING, MANUFACTURING METHOD, AND USE

(75) Inventors: Alexander Schmajew, Munich (DE); Hans Krueger, Munich (DE); Alois Stelzl, Munich (DE)

(73) Assignee: EPCOS AG, Munich (DE)

(*) Notice: Subject to any disclaimer, the term of this patent is extended or adjusted under 35 U.S.C. 154(b) by 588 days.

(21) Appl. No.: 12/258,301

(22) Filed: Oct. 24, 2008

(65) Prior Publication Data

US 2009/0104415 A1 Apr. 23, 2009

Related U.S. Application Data

(63) Continuation of application No. PCT/DE2007/000728, filed on Apr. 24, 2007.

(30) Foreign Application Priority Data

Apr. 25, 2006 (DE) .................. 10 2006 019 118

(51) Int. Cl.
*B32B 7/06* (2006.01)

(52) U.S. Cl.
USPC ........ 428/206; 428/195.1; 428/207; 428/914; 427/7; 40/299.01; 156/247

(58) Field of Classification Search
USPC ............ 428/195.1, 206, 207, 914; 40/299.04; 427/7; 156/247
See application file for complete search history.

(56) References Cited

U.S. PATENT DOCUMENTS

| | | | | |
|---|---|---|---|---|
| 4,497,848 A * | 2/1985 | Baran | | 427/106 |
| 4,583,833 A * | 4/1986 | Kazan | | 399/130 |
| 5,256,506 A * | 10/1993 | Ellis et al. | | 430/20 |
| 6,455,998 B1 * | 9/2002 | Moh et al. | | 313/477 R |
| 6,556,273 B1 * | 4/2003 | Wheeler et al. | | 352/92 |
| 6,838,739 B2 | 1/2005 | Stelzl et al. | | |
| 2002/0146889 A1 | 10/2002 | Coolbaugh et al. | | |
| 2003/0127718 A1 | 7/2003 | Haag | | |
| 2004/0232564 A1* | 11/2004 | Cher 'Khng et al. | | 257/784 |
| 2006/0000814 A1 | 1/2006 | Gu et al. | | |
| 2006/0051604 A1* | 3/2006 | Koops et al. | | 428/500 |

FOREIGN PATENT DOCUMENTS

| | | |
|---|---|---|
| DE | 100 16 867 A1 | 10/2001 |
| DE | 101 33 479 C1 | 12/2002 |
| DE | 10 2004 013 292 A1 | 10/2005 |
| JP | 4-67643 | 3/1992 |
| JP | 05-234836 A | 9/1993 |
| JP | 11-150215 A | 6/1999 |
| JP | 2003-151866 A | 5/2003 |
| JP | 2003-197794 A | 7/2003 |
| JP | 2004-506327 A | 2/2004 |
| WO | WO 99/25562 | 5/1999 |
| WO | WO 02/00441 A1 | 1/2002 |
| WO | WO 03/031193 A1 | 4/2003 |
| WO | WO 03/073504 A1 | 9/2003 |

* cited by examiner

*Primary Examiner* — Mark Ruthkosky
*Assistant Examiner* — Christopher Polley
(74) *Attorney, Agent, or Firm* — Slater & Matsil, L.L.P.

(57) ABSTRACT

A layer combination with a marking is proposed, for example, for a miniaturized electrical component. The layer combination includes a first layer and a different release layer, which is applied on it, on which a pattern is formed by a released pattern-like area. The release area is formed from an inorganic, semiconducting, insulating material, where the pattern produced thereon is machine-readable.

24 Claims, 3 Drawing Sheets

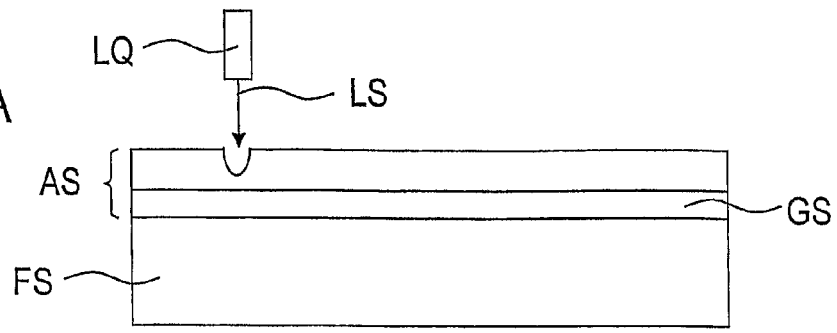
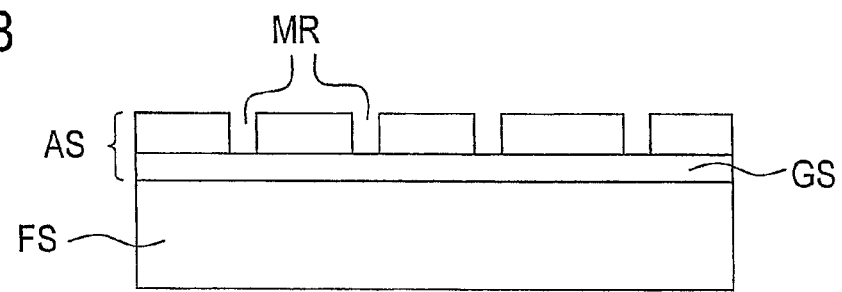
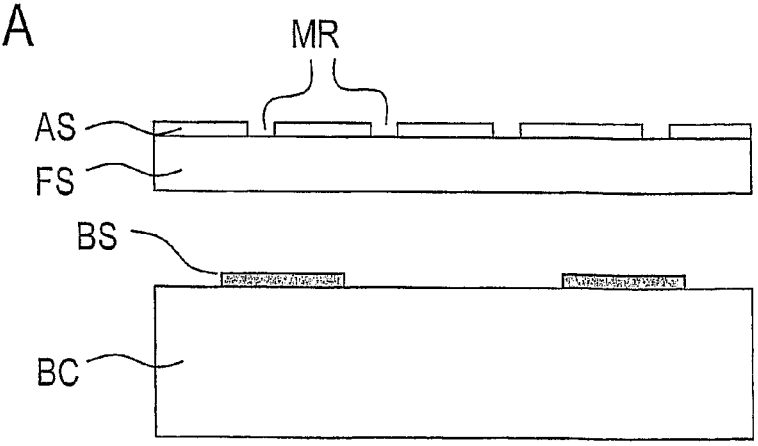

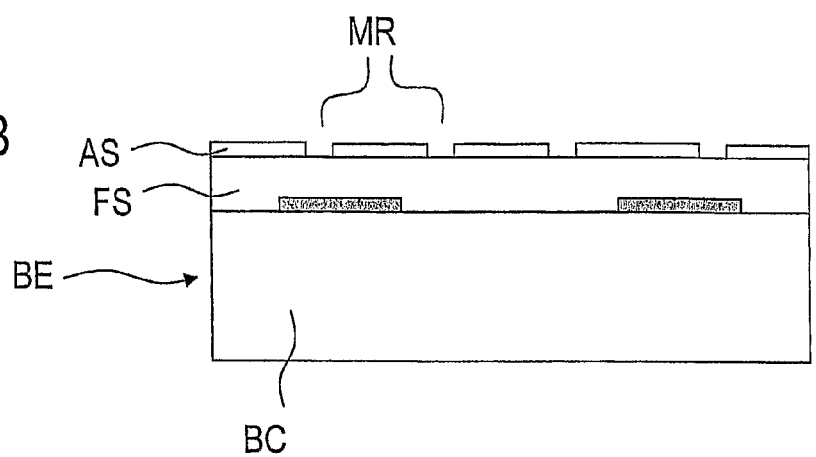

ELEMENT WITH OPTICAL MARKING, MANUFACTURING METHOD, AND USE

This application is a continuation of co-pending International Application No. PCT/DE2007/000728, filed Apr. 24, 2007, which designated the United States and was not published in English, and which claims priority to German Application No. 10 2006 019 118.8 filed Apr. 25, 2006, both of which applications are incorporated herein by reference.

BACKGROUND

In modern microelectronics, electronic components are often labeled for their identification. However, some components present, as the external layer of the component casing, a low-contrast or transparent layer, for example, filled reaction resins (glob top), glass, quartz, etc. It is very difficult to apply a text by laser with such components because the surfaces of such components after laser irradiation do not present sufficient contrast to be recognized using common optical systems.

Moreover, conventional laser labeling on mold or glob top compositions have a penetration depth greater than 15 µm, up to approximately 70 µm. This means that more than 70 µm of ablatable or inscribable material thickness must be present to prevent damage caused by the laser to the chip to be labeled. Accordingly, the minimum required component height increases to greater than 70 µm.

To circumvent this problem, an additional labeling film is frequently applied by lamination to the component surface, which film presents a higher contrast value after laser labeling. Besides the contrast layer, such a film also usually presents an adhesive layer, resulting then in a total thickness greater than 20 µm, which amounts to a considerable contribution to the total thickness (height) of the component in miniaturized components.

In the case of components that have very stringent requirements for a (small) component height, this method is thus not the optimal solution. In addition, with some components, unavoidable difficulties arise to an extent due to the film lamination and the associated processes. Thus, for example, an adhesive film may become detached, particularly after sawing processes to separate the components that have been produced simultaneously and in parallel on a wafer. In the case of materials that present, between the film and the substrate of the component, a thermal expansion coefficient that is not adjusted, strong additional stresses can occur in the substrate and in the casing, which limit the lifespan of the component and can even lead to premature failure or malfunction.

Another possibility of laser labeling consists in applying one or more thin conducting metal layers to the surfaces of such components, which surfaces present contrast between each other and with respect to the substrate, and in labeling them with a laser by ablation. Such a labeled coating, however, cannot be used with electromagnetically sensitive components, such as SAW and FBAR components, because the metal layer used interferes considerably with the functioning of such components as a result of capacitive coupling with the active structures of the component.

SUMMARY

In one aspect, the present invention provides a system for marking, such as labeling, which can produce sufficiently good optical contrast in a simple way and using a small height.

A first embodiment includes a component with a first layer or a body made of a first material and at least one lift-off layer that is different from the former and applied on it. The lift-off layer is released at least partially in a released area, where the released area forms a pattern. The lift-off layer comprises an inorganic material, which is electrically nonconducting or semiconducting. The pattern that is formed in the unreleased, or at least partially released, lift-off layer is machine-readable.

For example, a layer combination is proposed that includes a first layer or a first body and at least one lift-off layer, which differs from the first layer and is applied over it. The lift-off layer, in a release area, is partially released or ablated, resulting in a machine-readable pattern. For the lift-off layer, an inorganic material that is electrically nonconducting or semiconducting is used.

The proposed layer combination has an advantage that the pattern can be produced in a simple way by laser labeling or by automatic acquisition with machines. The nonconducting or semiconducting materials used for the lift-off layer make the latter suitable for combination with conventional electromagnetically sensitive components, so that the layer combination is suitable advantageously for labeling or marking miniaturized electrical and electronic components, in particular.

Suitable materials for the lift-off layer are known from semiconductor technology, so that a simple manufacture of the lift-off layer and high compatibility with the components are possible. These suitable materials, moreover, have the advantage that they can be produced in a thin layer thickness and that, by partial ablation, a machine-readable pattern that is optically easily detectable can be generated in it, already with a thin layer thickness. In the case of a minimum layer thickness of the layer combination, the total height of an electrical component provided with a pattern can be reduced to a minimum. The thickness of the lift-off layer can be chosen to be less than 1 µm, and it is, for example, 0.005-0.50 µm, preferably 0.025-0.150 µm.

In comparison to a given release procedure, it is advantageous to produce the lift-off layer with a material that can be released under milder conditions respectively more rapidly, or thus better, than the material of the first layer or of the first body. This can be achieved with a laser of appropriate wavelength, which can and is absorbed selectively in the lift-off layer.

Because the lift-off layer can be very thin, it is possible in components with this layer combination to prevent additional tensions generated by the latter.

In comparison to other labeling methods (methods for the manufacture of a pattern on a component) such as stamping, affixing an adhesive label, ink jet printing and other printing methods, laser labeling in the mentioned lift-off layer presents the highest flexibility and efficiency, it uses the smallest component surface area for the labeling, and it requires the smallest additional layer thickness compared to an unlabeled one. However, other release methods can also be used. It is preferred to choose a release method in which the component chip or the component structures applied to them are not damaged. This applies particularly to the case where the lift-off layer is applied directly to the component chip.

It is advantageous for the lift-off layer to comprise silicon or germanium. These two materials can be applied in a simple way, by known methods, in thin and homogeneous layers and with good adhesion to a multitude of different surface materials. They can be applied with minimal electrical conductivity, and they present sufficient absorption in the visible spectrum. Therefore, a pattern produced in them can be read in the visible spectrum by means of appropriate pattern recognition with detectors. These lift-off layers allow layer combinations with a number of first layers, which can definitely be transparent or low-contrast, without the machine readability of the produced pattern suffering as a result.

If the layer combination is used for marking an electrical component, then the first layer can be formed from the component itself, for example, from the component chip, its uppermost function layer, cover or casing. In a conventional unlabeled component, the lift-off layer is then the only other applied layer, and the pattern is generated in it. Many components are encapsulated with a plastic, and they present a surface made of plastic, for example, a reaction resin molding material based on an epoxide. On such a surface, the mentioned dielectrical layers can be applied with good adhesion. Even in a very thin layer, they already present a good optical contrast with the plastic.

In the case of a component that should have a minimum component height, and where, for the first layer or the first body of the layer combination, a function layer is used, such as, for example, a cover or casing layer of the component, the thickness of the cover or casing layer can be minimized. Therefore, it is necessary, during the partial release of the lift-off layer in the preparation of the pattern, to prevent entirely, or at least largely, any damage to the underlying uppermost component layer (first layer or first body). For this purpose, the release process is either not carried out entirely up to the surface of the first layer, or an appropriate material combination consisting of the first layer and a lift-off layer is chosen that presents sufficiently different release properties in connection with a laser suitable for releasing the lift-off layer. For example, for the lift-off layer, a material is chosen that presents a high absorption coefficient compared to the laser. The latter absorbs the laser radiation well, so that the material is consequently heated rapidly, and a bursting off or vaporization of the lift-off layer in the irradiated area is possible.

Besides using the appropriate material combination, it is also possible to design the surface of the first layer or of the first body, i.e., usually the surface of the component itself, in such a way that the laser beam is scattered or well reflected. One possibility to improve the scattering effect of the surface of the first layer would be to roughen it prior to the application of the lift-off layer. This is particularly advantageous for those first layers that are transparent to the wavelength of the laser used, for example, glass, crystals, and similar materials. In this way, the laser beam is prevented from penetrating and advancing through the transparent first layer to the component structures, which could then be damaged by the laser.

For the lift-off layer, silicon and germanium as well as their alloys in any ratio are particularly suitable. A lift-off layer comprising silicon or germanium can also be doped with elements to facilitate the laser labeling by improving the optical properties of the layer. Such elements have been chosen in such a way that they do not lead to a higher or to a high conductivity of the lift-off layer. Furthermore, for the lift-off layer, compound semiconductors are suitable, such as, for example, gallium arsenide, silicon carbide, indium phosphide and others. Suitable deposition methods exist for these materials as well. The laser used for the release can be adapted in terms of its wavelength to the given release material.

Advantageously, the lift-off layer is produced by CVD or PVD. These methods allow the manufacture of homogeneous layers. It is also possible to produce such layers from solution, or by means of a galvano-chemical method, on any first layers.

Besides the homogeneous layers, lift-off layers are also suitable that comprise nanoparticles and comprise particularly of a conglomerate, i.e., of a densely packed layer of nanoparticles. Such a lift-off layer can be obtained easily by spray application of a suspension containing the nanoparticles. The suspension can be carried out in a solvent and advantageously in water, and it can optionally also comprise a binder or a dispersant. By removing the solvent after the spray application of the layer, the latter can be converted into the desired firmly adhering state.

If a binder is used, then it can optionally also be burned out. However, it is also possible to use a thermally crosslinked binder which improves the stability and thus the resistance to abrasion of the nanoparticle layer.

The lift-off layer can be structured from nanoparticles of at least two different materials. In this way, it is possible to set certain layer properties optimally, or to adapt them to the given material of a first layer. Here, it is possible to use a combination of electrically conducting and nonconducting particles, where the mixing ratio is adjusted in such a way that the lift-off layer overall remains nonconducting. The nonconducting nanoparticles are preferably chosen in such a way that they present a high or imaginary refractive index for visible light or at least for a spectral range of visible light, so that, for the lift-off layer, a high labeling contrast is already possible with thin layer thicknesses. A high contrast can already be achieved if, in the released area, the lift-off layer is not yet removed completely, and respectively, the surface of the underlying first layer is not yet uncovered.

A nanoparticle lift-off layer can be removed directly with a release procedure, for example, by laser ablation by direct laser writing. However, it is also possible to produce a machine-readable pattern indirectly, for example, by compacting or solidifying the lift-off layer comprising nanoparticles with a laser in such a manner that it becomes resistant in comparison to the whole-surface dissolution method, so that only the compacted or fixed areas of the lift-off layer remain and form the pattern.

Another possibility is to provide thermochromic or photochromic nanoparticles in the lift-off layer, which present a color conversion after being irradiated with a laser of appropriate wavelength. In this way, layers that can be written on directly by laser radiation can be produced, which require no or only little release.

The lift-off layer can also comprise fluorescent substances, in particular, nanoparticles that are sensitized with fluorescent substances. A pattern that has been produced by the release becomes apparent when the lift-off layer is actively irradiated. The fluorescent substances can be chosen in such a way that a fluorescence in visible light is generated under irradiation with UV light, and thus the readability of the pattern is improved.

The lift-off layer can present several layers, of which at least one must present the mentioned desired properties. For example, it is possible to use, for the lift-off layer, a combination of a base layer and, on top of it, an additional laser absorbing layer. If the base layer presents a smaller absorption for laser radiation than the laser absorbing layer, then the depth of the generated pattern is successfully limited with this combined lift-off layer. This is appropriate for first layers and, particularly, component surfaces that are sensitive to laser radiation and present a particularly high absorption and transparency. It is also possible to choose the partial layer of the lift-off layer in such a way that, after the uppermost layer has been released and the base layer has been uncovered, a better contrast is produced than is the case, for example, for the combination with a first layer and a layer to be released.

A material for the base layer that presents a higher ablation threshold for the laser wavelength used can function as a stop layer for laser ablation, to protect the component from damage caused by the laser beam.

The base layer can also present a high scattering or a high reflection for the laser radiation, which also leads to a decreased ablation rate.

The proposed layer combination is suitable particularly for marking or labeling components that work with acoustic surface waves or with bulk waves, i.e., for example, for surface acoustic wave (SAW) components or film bulk acoustic resonator (FBAR) components.

BRIEF DESCRIPTION OF THE DRAWINGS

Below, the invention is explained in further detail with reference to embodiment examples and the associated figures. The figures serve only to illustrate the invention, are executed only schematically, and are not true to scale.

FIGS. 4a and 4b show methods for the manufacture of a layer combination; and

FIGS. 5a and 5b show an alternative method for the manufacture of a component with a marking.

Figure 1:
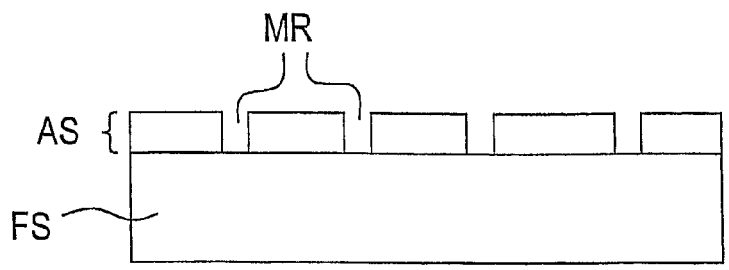
FIG. 1 shows a simple layer combination with a pattern produced in it.

The following reference characters can be used in conjunction with the drawings:

| | |
|---|---|
| GS | Base layer |
| MR | Marking, pattern |
| FS | First layer |
| AS | Lift-off layer |
| BE | Component |
| LS | Laser beam |
| LQ | Laser source |
| BC | Component chip |
| FS | Function layer |
| BS | Component structures |

DETAILED DESCRIPTION OF ILLUSTRATIVE EMBODIMENTS

FIG. 1 shows a simple embodiment example of the invention, in which, a lift-off layer AS is applied on a first layer FS. A pattern MR of depressions is generated in the lift-off layer AS, in which the is at least partially removed. In the figure, the lift-off layer AS is completely removed in the release areas representing the pattern.

The first layer FS can be any layer or any body, such as, for example, the component chip itself (for example, a piezoelectric material such as lithium tantalate (LT) or lithium niobate (LN)). Preferably it can be a function layer of a component, and consequently it can represent the uppermost layer of the component cover or the component casing. Accordingly, the first layer FS can be a crystalline, ceramic or semiconducting layer, as used for common chips or casings of miniaturized components.

The first layer FS can also be a polymer cover of an unencased component (e.g., a bare die), for example, a chip that is covered with a glob top. The first layer FS can also present several areas in which different materials form the surface of the first layer FS. The first layer FS can also be a component substrate, as used for electrical and electronic components, and, for example, for semiconductor components or components that work with acoustic waves. Accordingly, the first layer FS can be a substrate made of silicon, silicon germanium, gallium arsenide, indium phosphide or other semiconductors for a microelectronic component or a piezoelectronic substrate made of, for example, quartz, lithium tantalate, lithium niobate, aluminum nitride or zinc oxide, as used for components that work with acoustic waves. The surface of the first layer FS, however, can also present metal structures.

The cover layer AS can be a homogeneously structured layer made of an electrically insulating inorganic material, such as an insulation or semiconductor layer that can be produced in a layer deposition method of semiconductor technology such as CVD or PVD. The lift-off layer can comprise a layer made of silicon oxide, silicon carbide or other insulating compounds, for example, metal oxides, a semiconductor, such as silicon, germanium or a compound semiconductor. The lift-off layer can be doped, alloyed, or represent another homogeneous mixture of the mentioned materials.

However, it is also possible to produce the lift-off layer from the mentioned nanoparticles in a sufficiently abrasion resistant layer. The nanoparticles can be made uniformly of a single material, which is chosen from the above-mentioned materials. However, it is also possible to use a composition of the lift-off layer AS that includes a mixture of different nanoparticles, where it is also possible to embed conducting nanoparticles in a matrix made of nonconducting or electrically insulating nanoparticles.

For labeling, it is preferred to use direct laser labeling, where the selective parts of the lift-off layer can be released. For a lift-off layer made of Si or Ge, it is possible to use, for example, a green laser having, for example, a wavelength of 533 nm, for which a subjacent polymer layer (first layer FS) is transparent, so that it cannot be released, and is suitable as a bottom layer. However, for other materials and other combinations of lift-off layers and a subjacent uppermost component layer, other selectively working wavelengths can also be used.

Figure 2:
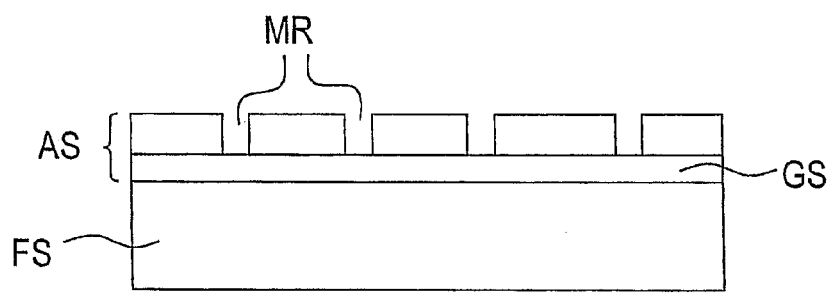
FIG. 2 shows an additional layer combination.

FIG. 2 shows an additional layer combination, where the lift-off layer AS also comprises, besides a layer that can be released, for example, by a laser beam, a base layer GS, which presents, for example, a decreased ablation rate compared to the laser beam. The base layer GS is applied directly on the first layer FS.

Figure 3:
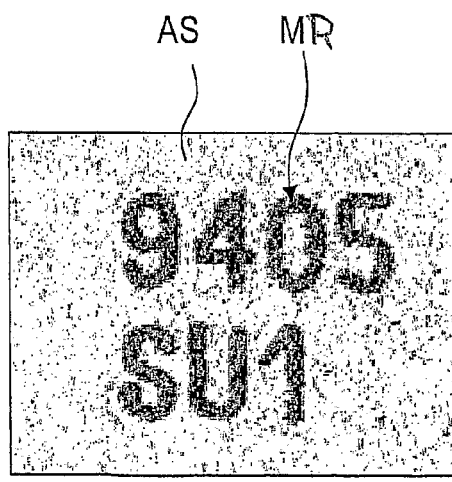
FIG. 3 shows a pattern generated in a layer combination in top view.

FIG. 3 shows a layer combination, in top view, which is provided with a pattern. The pattern is here in the form of a labeling, for example, a type number for an electrical component. The pattern MR is written with a scanning laser beam, which produces the pattern/labeling by releasing the lift-off layer AS.

The lift-off layer AS is absorbing particularly for visible light, and it presents, for example, at least one absorption band in the visible spectrum. Irrespective of this, the pattern MR that is detectable in the optical range can be formed from the surface of deeper layers, which has been uncovered therein, for example, of the base layer GS or of the first layer FS. This deeper layer, uncovered due to laser writing, forms an optical contrast with the intact lift-off layer AS, which has not been released. Such a contrast can also form if the lift-off layer AS is not removed completely and presents a narrowing layer thickness only in the area of the pattern, where the narrowing layer thickness leads to a change in the optical properties of the lift-off layer AS.

However, it is also possible to produce the pattern MR produced in the lift-off layer AS by phase conversion of the areas of the lift-off layer AS, which have been inscribed with the laser. Such a phase conversion can be of a chemical or physical type, for example, a modified crystal structure. A chemical/physical conversion can also be achieved with a lift-off layer that contains at least thermochromic or photochromic particles.

FIGS. 4a and 4b, collectively FIG. 4, show a first possibility of manufacturing a layer combination with the pattern generated in it. For this purpose, a cover layer is applied first to the first layer FS, for example, by deposition via gas phase or in a plasma, e.g., by a PVD or CVD method. A multilayered cover layer AS, as represented for example, in FIG. 4A, is generated accordingly in two steps.

After the generation of the cover layer, the surface of the cover layer AS is brushed according to a predetermined pattern MR, with the help of a laser source LQ, which generates a laser beam LS. The laser beam LS is absorbed in the uppermost layer of the cover layer AS and, in the irradiated area, it leads to a vaporization or bursting off of a layer area, as represented in FIG. 4A. The irradiation can occur with a continuous or pulsed laser beam, and it is continued until an ablation or other layer modification that generates sufficient contrast has been achieved. If the contrast is produced relative to an underlying layer, here the base layer GS of the cover, then the material ablation is continued until the surface of the base layer GS or the underlying first layer FS is uncovered. FIG. 4B shows the layer combination after the manufacture of the sample MR.

FIG. 5A shows an additional possibility in principle, where a component is provided with a marking, by means of which the pattern is produced separately from the component. For this purpose, first a layer combination is produced as represented in FIG. 1 or 2, and, for example, as shown in a reference to FIG. 4. As first layer FS, however, a function layer of a component is used here, particularly a function layer used for covering. On this function layer (first layer) FS, as indicated above, the cover layer AS is applied, and in it a pattern MR is produced.

The function layer FS is provided, for example, as a cover layer for a component that presents a component chip BC, usually a crystalline, for example, semiconducting or piezoelectric or simply only mechanically stable substrate, on which component structures BS can be arranged. These component structures BS that require a cover are now covered in a way which in itself is known with the function layer FS that is provided with a pattern MR. If the function layer FS is, for example, a plastic film, then the covering can be carried out in a simple way by lamination of the function layer, which, together with the lift-off layer AS and the pattern MR in it, represents the layer combination. FIG. 5B shows the finished component BE, which now presents additionally on the function layer FS, which in itself is known, the inventive lift-off layer AS, which is provided with a pattern MR.

This method can be carried out on the wafer plane, i.e., before the individualization of a plurality of components produced in parallel in a single wafer. Because the component chip BC with the component structures BS can be manufactured parallel to the layer combination provided with a pattern, which comprises the function layer FS, this type of production of a pattern can be carried out on the finished component BE in a particularly cost effective and time-saving way. Compared to the known component, which already presents the function FS, but no cover layer AS provided with a pattern, the total height of the component is increased only insubstantially. In such a combination, the lift-off layer AS can present, for example, a thickness of 5-500 nm, where, for example, in the case of a lift-off layer AS made of silicon, a 100 nm layer thickness is entirely sufficient for the lift-off layer AS, for the purpose of achieving a good contrast with respect to a polymer film.

The lift-off layer can be produced in a simple way by magnetron sputtering.

In such a lift-off layer, the pattern MR can be produced, for example, a labeling that indicates the component type, with a green laser of 532 nm and an inscription height of, for example, 0.2 mm.

The embodiment examples according to FIG. 1 or 2 and 5B are all characterized in that, as a result of the additional lift-off layer, with the pattern produced in it, the component height increases only insubstantially, regardless of whether the lift-off layer is applied directly on the "finished" component, or whether the lift-off layer is applied to a cover layer, which can be processed separately from the component chip, for example, a cover film, and which is applied only at that time as a layer combination on the component chip BC. In all cases, a high-contrast and thus easily readable and particularly machine-readable labeling of components is possible, which, because of their low-contrast surface, were not amenable to date for direct labeling without an impermissible increase of the total construction height of the component resulting from an embodiment of the invention.

The invention is suitable, particularly for components with electromagnetically sensitive component structures, because the pattern, respectively, the lift-off layer with the pattern is electromagnetically neutral. In addition, the invention is naturally also suitable for all components and, particularly, for miniaturized components, because it can be applied on practically all surfaces of components, component covers or component casings.

What is claimed is:

1. A labeled electronic component, comprising:
   a first region comprising a first material made of plastic, the first region being a layer or a body made of the first material; and
   at least one lift-off layer applied to the first region, the at least one lift-off layer comprising a second material that comprises silicon or germanium;
   wherein the at least one lift-off layer is at least partially lifted-off in a lift-off area,
   wherein the lift-off area forms a pattern,
   wherein the at least one lift-off layer is electrically nonconducting or semiconducting,
   wherein the pattern that is formed in the lift-off area of the at least one lift-off layer is a machine-readable label of the labeled electronic component,
   wherein the at least one lift-off layer comprises a conglomerate of nanoparticles of at least two different materials, and
   wherein the at least one lift-off layer comprises electrically conducting and nonconducting nanoparticles.

2. The layer combination according to claim 1, wherein the lift-off area of the at least one lift-off layer forms an optically detectable contrast.

3. The layer combination according to claim 1, wherein the at least one lift-off layer and the first region present different absorption properties.

4. The layer combination according to claim 1, wherein the at least one lift-off layer has a thickness between about 0.005 and about 0.50 μm.

5. The layer combination according to claim 1, wherein the first region comprises a component cover or a component casing.

6. The layer combination according to claim 1, wherein a surface of the first region can produce increased scattering of a laser beam directed on it, compared to the at least one lift-off layer.

7. The layer combination according to claim 6, wherein the surface of the first region comprises a roughened surface.

8. The layer combination according to claim 1, wherein the at least one lift-off layer comprises a homogeneous layer produced by CVD or PVD.

9. The layer combination according to claim 1, wherein the nanoparticles comprise thermochromic or photochromic materials.

10. The layer combination according to claim 1, wherein the layer combination is applied to a surface of a component that works with surface acoustic waves or with bulk acoustic waves.

11. A component in combination with the layer combination according to claim 1, comprising a component chip that includes the first region as an uppermost function layer of the component, wherein the at least one lift-off layer is arranged over the uppermost function layer of the component.

12. The layer combination according to claim 1, wherein the at least one lift-off layer and the first region present different reflection properties.

13. A method for producing a labeled electronic component with a machine-readable pattern on a surface of a first region, the method comprising:
  applying at least one lift-off layer on the surface of the first region; and
  subsequently, using a laser beam to form a pattern in a lift-off area of the lift-off layer, the pattern being formed by at least a partial lifting off of the lift-off layer;
  wherein the first region comprises a first material made of plastic, the first region being a layer or a body made of the first material;
  wherein the at least one lift-off layer applied to the first region comprises a second material that comprises silicon or germanium;
  wherein the at least one lift-off layer is at least partially lifted-off in the lift-off area,
  wherein the lift-off area forms a pattern,
  wherein the at least one lift-off layer is electrically nonconducting or semiconducting,
  wherein the pattern that is formed in the lift-off area of the at least one lift-off layer is a machine-readable label of the labeled electronic component,
  wherein the at least one lift-off layer comprises a conglomerate of nanoparticles,
  wherein the at least one lift-off layer comprises a conglomerate of nanoparticles of at least two different materials, and
  wherein the at least one lift-off layer comprises electrically conducting and nonconducting nanoparticles.

14. The method according to claim 13, wherein applying the lift-off layer comprises depositing the lift-off layer from a gas phase or from a plasma.

15. The method according to claim 13, wherein applying the lift-off layer comprises performing a spray application of a suspension of nanoparticles.

16. The method according to claim 14, wherein applying the lift-off layer comprises applying a silicon or germanium layer with a layer thickness of 0.005-0.50 µm, and wherein using a laser beam comprises using a green laser.

17. The method according to claim 13, wherein the lift-off layer and the laser beam are chosen in such a way that laser absorption within the lift-off layer is greater than in the first layer.

18. The method according to claim 13, further comprising roughening the surface of the first region before applying the lift-off layer to increase scattering of the laser beam.

19. The method according to claim 13, wherein using the laser beam comprises removing the lift-off layer until the surface of the first layer is uncovered.

20. The method according to claim 13, wherein the lift-off layer is applied to the surface of a covered or encased component, which works with surface acoustic waves or bulk acoustic waves.

21. The method according to claim 13,
  wherein the lift-off layer is applied on the surface of a cover film,
  wherein the cover film is applied for covering and as a protective film on a component that works with surface acoustic waves or bulk acoustic waves, and
  wherein the pattern is formed subsequently.

22. A method of marking a component, the method comprising:
  providing a miniaturized electrical or electronic component having a first region; and
  forming a layer over a surface of the first region of the component, the layer including a machine readable pattern formed by removing regions of the layer;
  wherein the first region and the layer form a layer combination;
  wherein the first region comprises a first material made of plastic, the first region being a layer or a body made of the first material;
  wherein the layer comprises at least one lift-off layer applied to the first region, the at least one lift-off layer comprising a second material that comprises silicon or germanium;
  wherein the at least one lift-off layer is at least partially lifted-off in a lift-off area;
  wherein the lift-off area forms a pattern;
  wherein the at least one lift-off layer is electrically nonconducting or semiconducting,
  wherein the pattern that is formed in the lift-off area of the at least one lift-off layer is a machine-readable label of the labeled electronic component,
  wherein the at least one lift-off layer comprises a conglomerate of nanoparticles,
  wherein the at least one lift-off layer comprises a conglomerate of nanoparticles of at least two different materials, and
  wherein the at least one lift-off layer comprises electrically conducting and nonconducting nanoparticles.

23. The method according to claim 22, wherein the component comprises a surface acoustic wave component or bulk acoustic wave component with a height of less than 500 µm.

24. The method according to claim 22, wherein the component comprises a surface acoustic wave component or bulk acoustic wave component with a height of less than 1500 µm.

* * * * *